United States Patent
Lin et al.

[19]

[11] Patent Number: 5,877,052
[45] Date of Patent: Mar. 2, 1999

[54] RESOLUTION OF HEMISPHERICAL GRAINED SILICON PEELING AND ROW-DISTURB PROBLEMS FOR DYNAMIC RANDOM ACCESS MEMORY, STACKED CAPACITOR STRUCTURES

[75] Inventors: Dahcheng Lin, Hsinchu; Jung-Ho Chang, Uen-Lin; Hsi-Chuan Chen, Tainan; Kuo-Shu Tseng, Chutung, all of Taiwan

[73] Assignee: Vanguard International Semiconductor Corporation, Hsin-Chu, Taiwan

[21] Appl. No.: 94,463

[22] Filed: Jun. 11, 1998

[51] Int. Cl.[6] .............. H01L 21/8234; H01L 21/8242; H01L 21/20
[52] U.S. Cl. .............. 438/238; 438/254; 438/255; 438/397; 438/398
[58] Field of Search ................... 438/254, 255, 438/210, 397, 387, 398, 386, 238, 239, 243, 244

[56] References Cited

U.S. PATENT DOCUMENTS

| | | | |
|---|---|---|---|
| 5,256,587 | 10/1993 | Jun et al. | 437/52 |
| 5,302,540 | 4/1994 | Ko et al. | 437/47 |
| 5,639,685 | 6/1997 | Zahurak et al. | 437/60 |
| 5,656,531 | 8/1997 | Thakur et al. | 438/398 |
| 5,691,228 | 11/1997 | Ping et al. | 437/60 |
| 5,763,306 | 6/1998 | Tsai | 438/238 |

Primary Examiner—John F. Niebling
Assistant Examiner—Christopher Lattin
Attorney, Agent, or Firm—George O. Saile; Stephen B. Ackerman

[57] ABSTRACT

A method for creating stacked capacitor structures, with increased surface area, obtained using storage node electrode structures comprised of an HSG silicon layer, on a heavily doped amorphous silicon layer, both overlying polysilicon storage node shapes, has been developed. A dilute hydrofluoric acid pre-clean procedure is used prior to depositing a heavily doped amorphous silicon layer, on underlying polysilicon storage node shapes. An overlying second amorphous silicon layer is in situ deposited, in the same furnace used for the prior deposition of heavily doped amorphous silicon layer, followed by an in situ seeding/annealing procedure, converting the second amorphous silicon layer to an HSG silicon layer. This invention features the use of the acid pre-clean, to improve adhesion of the heavily doped amorphous silicon layer, to underlying polysilicon storage node shapes. In addition the width of the polysilicon storage node shapes is initially designed to be narrow, to accept subsequent amorphous silicon depositions, and thus to result in the desired spacing between storage node electrodes, after deposition of the amorphous silicon layers, on the sides of the polysilicon storage node shapes.

27 Claims, 4 Drawing Sheets

RESOLUTION OF HEMISPHERICAL GRAINED SILICON PEELING AND ROW-DISTURB PROBLEMS FOR DYNAMIC RANDOM ACCESS MEMORY, STACKED CAPACITOR STRUCTURES

BACKGROUND OF THE INVENTION (1) Field of the Invention

The present invention relates to a method used to create a stacked capacitor structure, for a dynamic random access memory, (DRAM) device.

(2) Description of the Prior Art

Improved device performance and the reduced manufacturing costs of these devices, are major objectives of the semiconductor industry. These objectives have been successfully addressed by the ability of the semiconductor industry to fabricate semiconductor memory chips with sub-micron features, or micro-miniaturization. Sub-micron features allow the reduction in performance degrading capacitances and resistances to be realized. In addition the smaller features result in a smaller chip, however still possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller, or sub-micron, features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 64 million cells per chip, or greater, has resulted in a specific cell in which a smaller transfer gate transistor is being used, resulting in less of an overlying area for placement of overlying STC structures.

One method of maintaining, or increasing STC capacitance, while still decreasing the lateral dimension of the capacitor, has been the use of rough, or hemispherical grain, (HSG), silicon layers. For example Thakur et al, in U.S. Pat. No. 5,656,531, describe a process for forming an HSG silicon layer, on a capacitor storage node structure, however this invention does not provide a surface preparation, applied to the storage node shape, prior to deposition of the amorphous silicon layer used for HSG formation. The absence of a pre-clean, prior to amorphous silicon deposition can result in poor adhesion between the amorphous silicon layer and the storage node shape. Zahurak et al, in U.S. Pat. No. 5,639,685, do show the use of a pre-clean procedure, however this pre-clean step is applied prior to the deposition of the polysilicon layer, used for the storage node shape, not prior to the deposition of the amorphous silicon layers, used for HSG formation. This invention will describe a process for increasing the surface area of a storage node structure, and thus the capacitance of the DRAM capacitor, via the use of an HSG layer on a patterned polysilicon storage node structure. However this invention will feature a pre-clean sequence, used prior to a deposition of a heavily doped amorphous silicon layer, on the patterned polysilicon storage node structure. The use of a heavily doped amorphous layer, prevents silicon migration. In addition native oxide formation, at the interface between HSG and the underlying silicon stack, can lead to HSG peeling. The a pre-clean procedures, followed by the deposition of a heavily doped silicon layer, prior to HSG formation, retards the native oxide growth, thus reducing the risk of peeling, or of poor adhesion of the HSG layer, to the underlying stack. This invention also features a subsequent deposition of a lightly doped, or undoped, amorphous silicon layer, and a subsequent seeding/anneal procedure, performed in situ, in the same furnace used to deposit the heavily doped amorphous silicon layer, resulting in the formation of a roughened HSG surface. In addition this invention will describes a storage node structure, intentionally designed with a narrow width, to accommodate the additional amorphous silicon layers, thus avoiding shorts between rows of tightly packed capacitor structures.

SUMMARY OF THE INVENTION

It is an object of this invention to increase the surface area of a stacked capacitor structure, for a DRAM device, via the use of a storage node electrode, featuring a top surface comprised of HSG silicon.

It is another object of this invention to perform a dilute hydrofluoric, (DHF), acid pre-clean procedure, on a polysilicon storage node shape, prior to deposition of amorphous silicon layers, to improve the adhesion of a subsequent HSG silicon layer, to an underlying polysilicon storage node shape.

It is still another object of this invention to deposit a thin, heavily doped amorphous silicon layer, on the DHF pre-cleaned, polysilicon storage node shape, followed by an in situ deposition of a lightly doped amorphous silicon layer.

It is still yet another object of this invention to perform a seeding/annealing procedure, in situ, after deposition of the lightly doped, amorphous silicon layer, forming an HSG silicon layer from the underlying, lightly doped amorphous silicon layer.

In accordance with the present invention a method for forming an HSG silicon layer, on the top surface of a storage node shape, has been developed, featuring a process sequence comprised of an acid pre-clean procedure, followed by a deposition of a thin heavily doped amorphous silicon layer, and an in situ deposited layer of a lightly doped amorphous silicon layer, and than followed by in situ seeding/annealing procedures. A transfer gate transistor comprised of: a thin gate insulator; an insulator capped, polysilicon gate structure, a lightly doped source/drain region; insulator spacers on the sides of the polysilicon gate structure; and a heavily doped source/drain region; is formed on a semiconductor substrate. An insulator layer, is next deposited, planarized, and followed by the opening of a storage node contact hole in the insulator layer, made to expose the source region of the transfer gate transistor. Polysilicon storage node shapes are formed, completely filling the storage node contact hole, and with a portion of the polysilicon storage node shapes overlying the top surface of the insulator layer. After a DHF pre-clean procedure, a thin, heavily doped amorphous silicon layer is deposited, followed by the in situ deposition of a lightly doped amorphous silicon layer. In situ annealing/seeding procedures, performed in the same furnace used to deposit the amorphous silicon layers, is next used to convert the lightly doped amorphous silicon layer to a roughened surface, HSG silicon layer. A capacitor dielectric layer is next formed on the HSG silicon surface, followed by the deposition of an overlying polysilicon layer. A patterning procedure is than applied to the overlying polysilicon layer, creating an upper electrode shape, for the STC structures. The patterning procedure is continued by etching of the capacitor dielectric layer, etching of the HSG silicon layer, and etching of the thick, heavily doped amorphous silicon layer, creating the storage node electrode structures, for the DRAM stack capacitor structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming an STC structure, for a DRAM device, featuring a roughened HSG silicon layer, on the top surface of a storage node electrode, used to increase the surface area, and the capacitance of the STC structure, will now be described in detail. The transfer gate transistor, used for this DRAM device, in this invention, will be an N channel device. However the STC structure, with the increased surface area described in this invention, can also be applied to P channel, transfer gate transistor.

Figure 1:
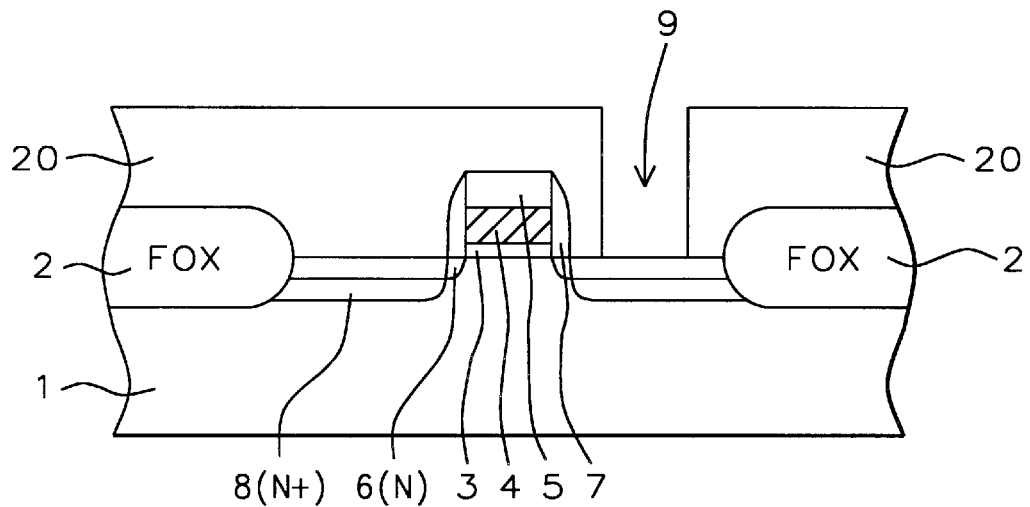
FIGS. 1–7, which schematically, in cross-sectional style, show the key fabrication stages used to create a a STC structure for a DRAM device, in which the top surface of a storage node electrode is comprised with a roughened HSG silicon layer.

Referring to FIG. 1, a P type, semiconductor substrate 1, with a <100>, single crystalline orientation, is used. Field oxide, (FOX), regions 2, used for isolation purposes, are formed via thermal oxidation procedures, using a patterned oxidation resistant mask, such as a silicon nitride—silicon oxide composite insulator layer, to protect subsequent device regions from the oxidation procedure. After formation of FOX regions 2, at a thickness between about 2000 to 5000 Angstroms, the composite insulator layer is removed, using hot phosphoric acid for silicon nitride, while a buffered hydrofluoric acid solution is used for the underlying silicon oxide layer. After a series of wet cleans, a gate insulator layer 3, of silicon oxide is thermally grown in an oxygen-steam ambient, at a temperature between about 750° to 1050° C., to a thickness between about 40 to 200 Angstroms. A polysilicon layer 4, is next deposited using low pressure chemical vapor deposition, (LPCVD), procedures, at a temperature between about 500° to 700° C., to a thickness between about 500 to 4000 Angstroms. The polysilicon can either be grown intrinsically and doped via ion implantation of arsenic or phosphorous, at an energy between about 10 to 80 KeV, and using a dose between about 1E13 to 1E16 atoms/cm$^2$, or the polysilicon layer can be grown using in situ doping procedures, via the incorporation of either arsine or phosphine to a silane/disilane ambient. If desired a polycide, (metal silicide—polysilicon), can be used in place of polysilicon layer 4, to lower the resistance of the word line. This can be accomplished using either a tungsten silicide layer, or a titanium silicide layer, on an underlying polysilicon layer. A first insulator layer 5, comprised of silicon oxide, used as a cap insulator layer, is next grown via the use of either LPCVD or plasma enhanced chemical vapor deposition, (PECVD), procedures to a thickness between about 600 to 2000 Angstroms. First insulator layer 5, can also be a silicon nitride layer, again deposited using LPCVD or PECVD procedures, to a thickness between about 600 to 2000 Angstroms. Conventional photolithographic and reactive ion etching, (RIE), procedures, using CHF$_3$ as an etchant for first insulator layer 5, and using Cl$_2$ as an etchant for polysilicon layer 4, are used to create the polysilicon gate structure, comprised of polysilicon layer 4, with overlying capping, first insulator layer 5, shown schematically in FIG. 1. Photoresist removal is accomplished via plasma oxygen ashing and careful wet cleans.

A lightly doped source/drain region 6, is next formed via ion implantation of phosphorous, at an energy between about 5 to 60 KeV, at a dose between about 1E13 to 1E15 atoms/cm$^2$. A second insulator layer, comprised of silicon oxide, is then deposited using either LPCVD or PECVD procedures, at a temperature between about 400° to 850° C., to a thickness between about 1500 to 4000 Angstroms, followed by an anisotropic RIE procedure, using CHF$_3$ as an etchant, creating insulator spacers 7, on the sides of the polysilicon/polycide gate structure. Insulator spacers 7, can also be comprised of silicon nitride. A heavily doped source/drain region 8, is then formed via ion implantation of arsenic, at an energy between about 30 to 100 KeV, at a dose between about 1E14 to 5E16 atoms/cm$^2$. The result of these steps are also shown schematically in FIG. 1.

A third insulator layer 20, comprised of either silicon oxide, boro-phosphosilicate glass, (BPSG), or phosphosilicate glass, (PSG), is next deposited, using LPCVD or PECVD procedures, at a temperature between about 600° to 800° C., to a thickness between about 3000 to 10000 Angstroms. Third insulator layer 20, is grown using tetraethylorthosilicate, (TEOS) as a source with the addition of either diborane and phosphine, for the BPSG layer, or the addition of only phosphine, for the PSG layer. Third insulator layer 20, is then planarized using chemical mechanical polishing, to provide a smoother surface for subsequent depositions and patterning procedures. Conventional photolithographic and RIE procedures, using CHF$_3$ as an etchant, are used to open storage node contact hole 9, in third insulator layer 20, exposing the top surface of heavily doped source/drain region 8. Photoresist removal is performed via use of plasma oxygen ashing and careful wet cleans. The result of these procedures are again schematically shown in FIG. 1.

Figure 2:
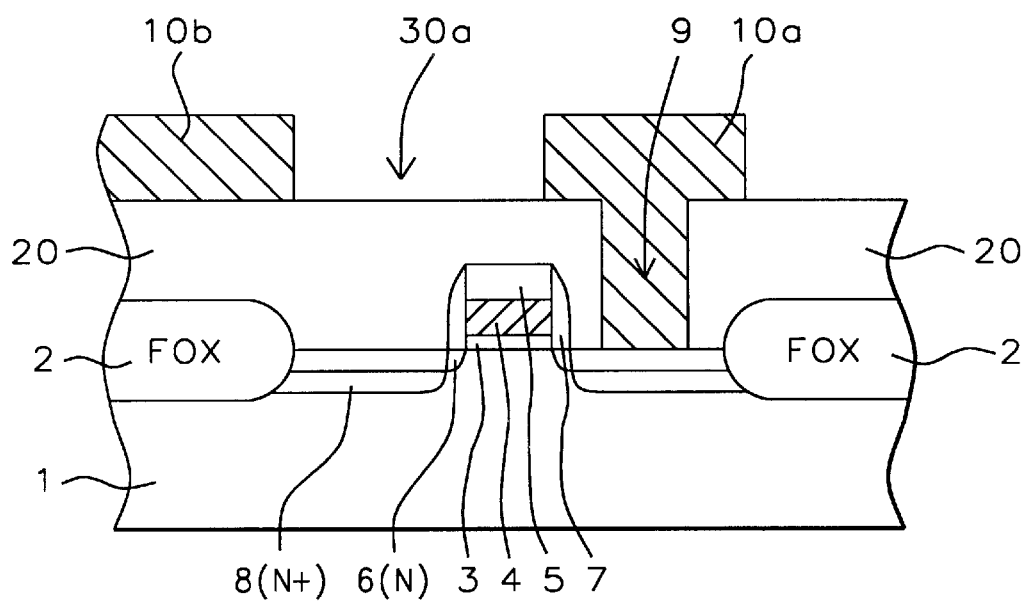

Referring to FIG. 2, a polysilicon silicon layer is deposited, via LPCVD procedures, at a temperature between about 500° to 700° C., to a thickness between about 1000 to 10000 Angstroms, completely filling storage node contact hole 9. The polysilicon layer is deposited using an in situ doping procedure, via the addition of arsine or phosphine, to a silane ambient. Photolithographic and RIE procedures, using Cl$_2$ as an etchant, are used to pattern the polysilicon layer, creating polysilicon storage node shapes 10a, in storage node contact hole 9, and a neighboring polysilicon storage node shape 10b. This is schematically shown in FIG. 2. The width of the polysilicon storage node shapes, is designed to be narrower than the desired final width of a storage node electrode, to accommodate the additional amorphous silicon layers, that will subsequently reside on the sides of polysilicon storage node shapes 10a, and 10b. The space 30a, between polysilicon storage node shapes, at this stage of the process is between about 1500 to 4000 Angstroms. Removal of the masking photoresist shape, used to define polysilicon storage node shapes 10a, and 10b, is accomplished via plasma oxygen ashing and careful wet cleans.

Figure 3:
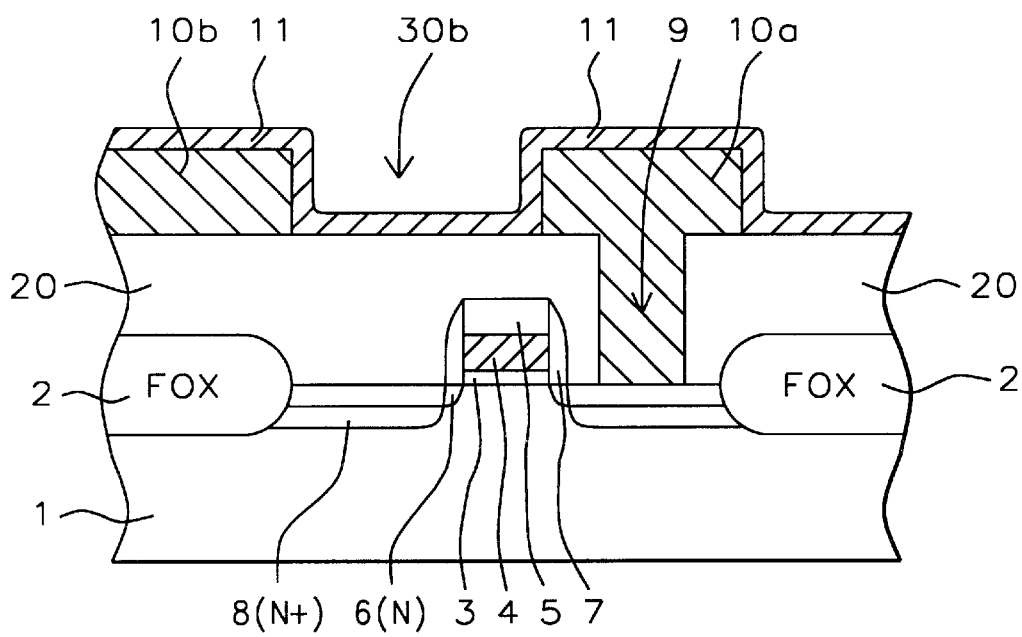

A critical pre-clean procedure, using a dilute hydrofluoric, (DHF), acid solution, using 1 part HF, to between about 100 to 200 parts de-ionized water, at room temperature, about 25° C., is next performed to remove native oxide from the surface of polysilicon storage node shapes 10a, and 10b. Next a heavily doped, amorphous silicon layer 11, is deposited in an LPCVD furnace, at a temperature between about 500° to 550° C., to a thickness between about 50 to 1000 Angstroms. Amorphous silicon layer 11, is in situ doped, during the LPCVD deposition, via the addition of phosphine, to a silane, or to a disilane ambient, resulting in amorphous silicon layer 11, shown schematically in FIG. 3, having a N type surface concentration greater than 4E20 atoms/cm$^3$. The level of dopant needed for saturation is a function of the deposition temperature, and thus using the deposition temperature of 500° to 550° C., a dopant level, or saturation level of 4E20 atoms/cm$^3$, or greater, resulted. The heavy doping in amorphous silicon layer 11, is needed to prevent silicon migration, that can occur during subsequent seeding/annealing cycles, subsequently used to create an HSG layer. If amorphous silicon layer 11, were lightly doped, silicon migration may have occurred. The space 30b, between polysilicon storage node shapes has now been narrowed as a result of deposition of amorphous silicon layer 11, on the sides of polysilicon storage node shapes 10a, and 10b.

Figure 4:
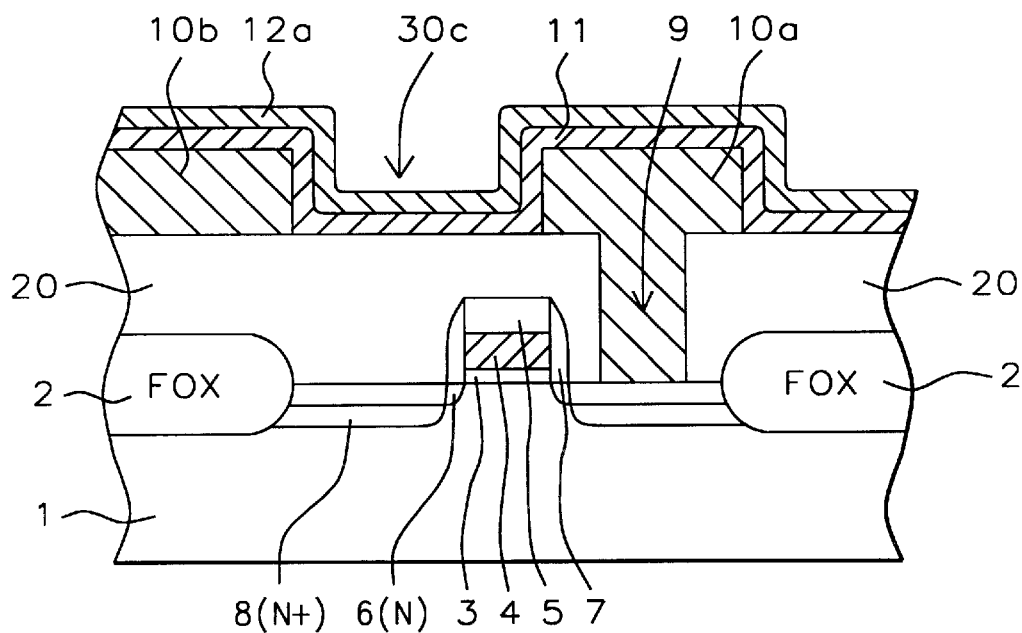
Figure 5:
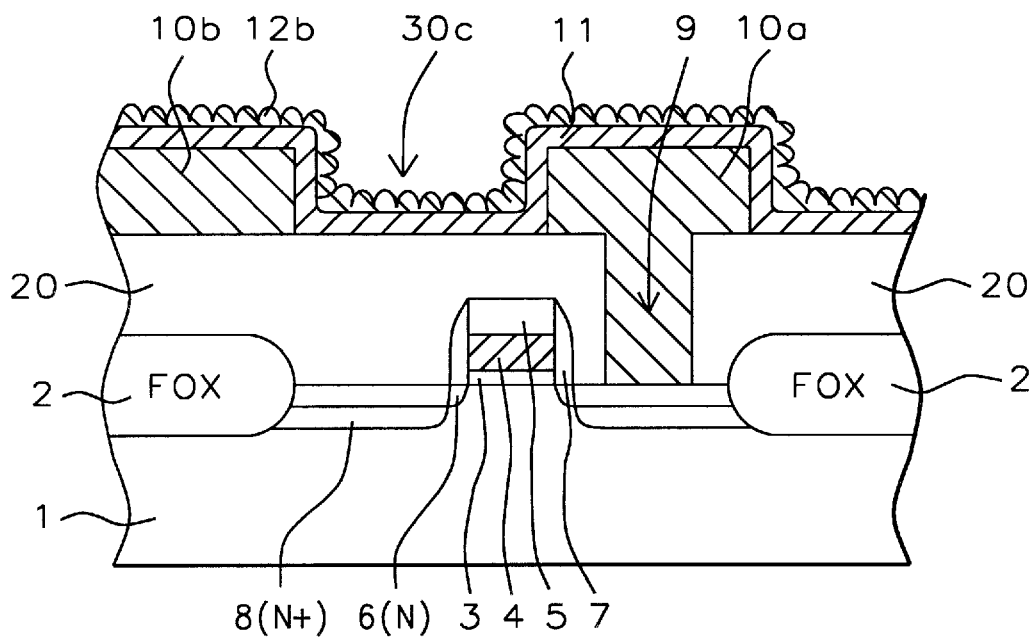

Another amorphous silicon layer 12a, used as a seed layer for a subsequent HSG layer, is next in situ deposited, in the same LPCVD furnace that was used for deposition of heavily doped amorphous silicon layer 11. Amorphous silicon layer 12a, is deposited at a temperature below 550° C., to a thickness between about 50 to 500 Angstroms. Amorphous silicon layer 12a, can be undoped, or it can be lightly doped, or a combination of both doped and undoped layers, with in situ doping occurring during deposition, via the incorporation of phosphine, to a silane or disilane ambient, resulting in a bulk concentration between about 0 to 4E20 atoms/cm$^3$. This is schematically shown in FIG. 4. Space 30c, between polysilicon storage node shapes 10a, and 10b, is now further reduced, between about 1400 to 3000 Angstroms. A critical seeding/annealing procedure is next performed, in situ, in the LPCVD furnace, resulting in the formation of HSG silicon layer 12b, schematically shown in FIG. 5. First HSG seeds are formed on amorphous silicon layer 12a, using silane or disilane, in a nitrogen ambient, at a seeding concentration equal to, or less than 1.0E-3 moles/m$^3$, at a temperature between about 550° to 580° C., at a pressure less than one torr, and for a time between about 5 to 120 min. Next an anneal procedure is in situ performed, in a pure nitrogen ambient, at a temperature between about 550° to 580° C., for a time between about 0 to 120 min, creating HSG layer 12b, schematically shown in FIG. 5. The doping supplied to HSG silicon layer 12b, from underlying amorphous silicon layer 11, prevented silicon migration from occurring during the anneal cycle. Silicon migration, if present, can interfere with the formation of HSG silicon layer 12b. The desired space 30c, between polysilicon storage node shapes, was achieved by allowing initially formed, narrow polysilicon storage node shapes, to grow to the desired width, via subsequent depositions of amorphous silicon layers. In addition the adhesion of HSG silicon layers, to polysilicon storage node structures, is improved via the inclusion of intermediate, heavily doped amorphous silicon layer 11.

Figure 6:
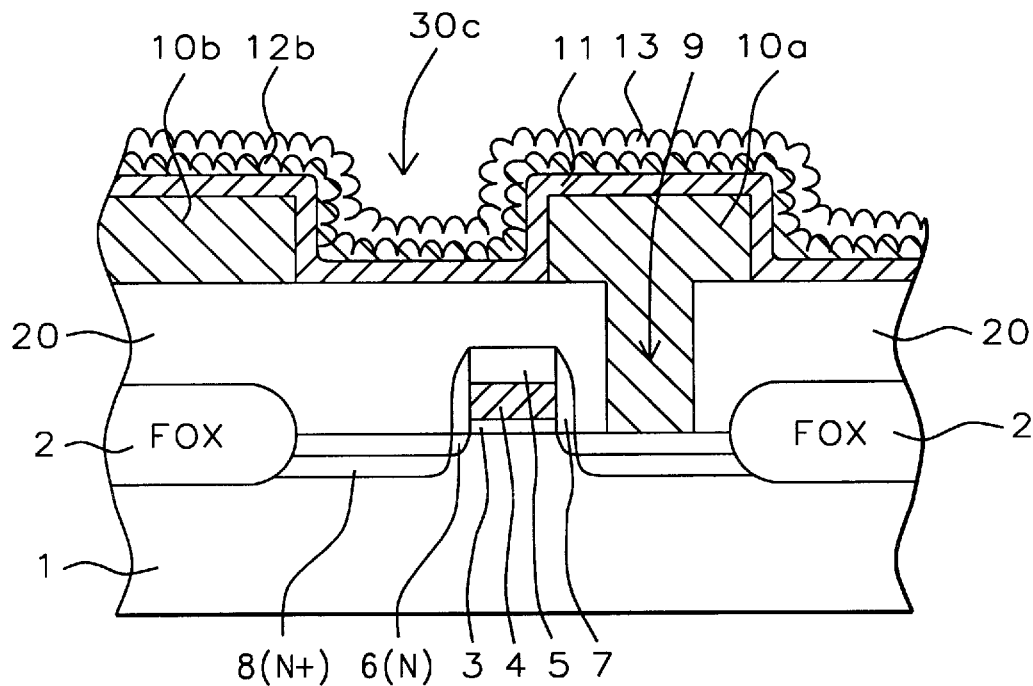
Figure 7:
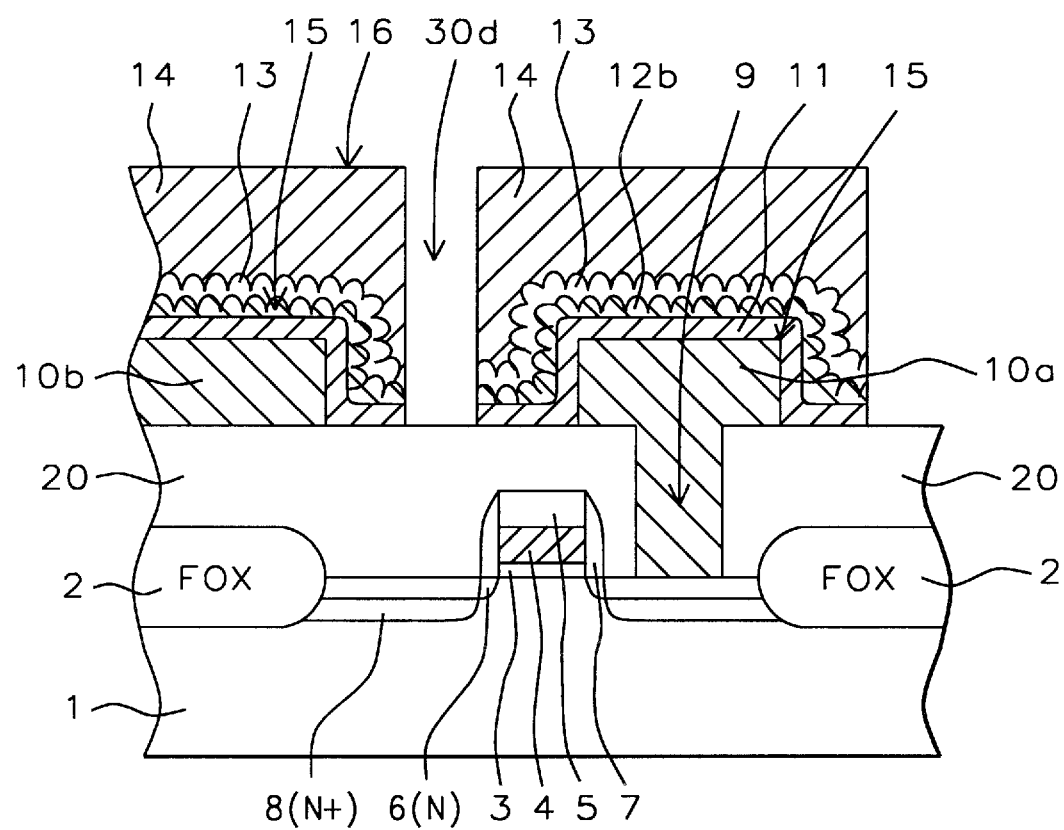

A capacitor dielectric layer 13, exhibiting a high dielectric constant, such as ONO, (Oxidized—silicon Nitride—silicon Oxide), or NO, (silicon Nitride Oxidized), is next formed on HSG silicon layer 12b. The ONO layer is formed by initially growing a silicon dioxide layer, on HSG silicon layer 12b, between about 10 to 50 Angstroms, followed by the deposition of a silicon nitride layer, between about 10 to 60 Angstroms. Subsequent thermal oxidation of the silicon nitride layer results in the formation of a silicon oxynitride layer on silicon oxide, at a silicon oxide equivalent thickness of between about 40 to 80 Angstroms. This is schematically shown in FIG. 6. Finally a polysilicon layer is deposited, via LPCVD procedures, at a temperature between about 500° to 700° C., to a thickness between about 500 to 2000 Angstroms. Doping of polysilicon layer is accomplished via an situ doping deposition procedure, by the addition of phosphine, to the silane or a disilane ambient. Photolithographic and RIE procedures, using $Cl_2$ as an etchant for polysilicon, are next employed to pattern the polysilicon layer, creating polysilicon upper electrode structures 14, schematically shown in FIG. 7. The patterning procedure is continued, using the same photoresist shape, (not shown in the drawings), used for definition of polysilicon upper electrode structures 14, as a mask, using $CHF_3$ as an etchant for capacitor dielectric layer 13, and using $Cl_2$ as an etchant for HSG silicon layer 12b, and for amorphous silicon layer 11, creating storage node electrodes 15. The DRAM, stacked capacitor structures 16, are comprised of polysilicon upper electrode structures 14, capacitor dielectric layer 13, and storage node electrodes 15, with space 30d, between about 1000 to 2000 Angstroms, now existing between stacked capacitor structures. Photoresist is again removed via plasma oxygen ashing and careful wet cleans.

While this invention has been particularly shown and described with reference to the preferred embodiments thereof, it will be understood by those skilled in the art that various changes in form and details may be made without departing from the spirit and scope of this invention.

What is claimed is:

1. A method for fabricating a stacked capacitor structure, for a DRAM device, on a semiconductor substrate, comprising the steps of:

providing a transfer gate transistor, on said semiconductor substrate, comprised of a polysilicon gate structure, on a gate insulator layer, with a source/drain region in an area of said semiconductor substrate, not covered by said polysilicon gate structures;

forming a storage node contact hole, in an insulator layer, exposing the top surface of a source region;

forming storage node shapes, on the top surface of said insulator layer, with a first space, on the top surface of said insulator layer, located between said storage node shapes, and with a storage node shape completely filling said storage node contact hole;

performing a wet acid pre-clean procedure, to remove native oxide from the surface of said storage node electrode shapes;

depositing a first amorphous silicon layer, on said storage node shapes, and on said first space, between said storage node shapes, creating a second space, between said storage node shapes;

depositing a second amorphous silicon layer, on said first amorphous silicon layer, creating a third space between said storage node shapes;

seeding/annealing to convert said second amorphous silicon layer to a hemispherical grain, (HSG), silicon layer;

forming a capacitor dielectric layer on said HSG silicon layer;

depositing a polysilicon layer;

forming a photoresist shape; and patterning of said polysilicon layer, using said photoresist shape, to form polysilicon upper electrode shapes, for stacked capacitor structures, and patterning of said capacitor dielectric layer, of said HSG silicon layer, and of said first amorphous silicon layer, using said photoresist shape as a mask, to create storage node electrodes, for said stacked capacitor structures, and creating a fourth space, located between said storage node electrodes.

2. The method of claim 1, wherein said storage node shapes are comprised of polysilicon, obtained using a polysilicon layer, via an LPCVD procedure, at a temperature between 500° to 700° C., to a thickness between about 1000 to 10000 Angstroms, and doped in situ via the addition of phosphine, or arsine, to a silane, or to a disilane ambient.

3. The method of claim 1, wherein said storage node shapes are formed via an anisotropic RIE procedure, applied to a polysilicon layer, using $Cl_2$ as an etchant.

4. The method of claim 1, wherein said first space, located between said storage node shapes is between about 1500 to 4000 Angstroms.

5. The method of claim 1, wherein said wet acid pre-clean procedure, applied to said storage node shapes, is performed in a dilute hydrofluoric acid solution, comprised of 1 part HF, to between about 100 to 200 parts de-ionized water, at room temperature, about 25° C.

6. The method of claim 1, wherein said first amorphous silicon layer is deposited in an LPCVD furnace, at a temperature between about 500° to 550° C., to a thickness between about 50 to 1000 Angstroms, and in situ doped during deposition, via the addition of phosphine to a silane, or disilane ambient, resulting in a bulk concentration, for said first amorphous silicon layer, of about $4E20$ atoms/$cm^3$, or greater, to a saturated level.

7. The method of claim 1, wherein said second amorphous silicon layer is deposited intrinsically, in situ, in an LPCVD furnace, at a temperature below 550° C., to a thickness between about 50 to 500 Angstroms.

8. The method of claim 1, wherein said second amorphous silicon layer is deposited, in situ, in an LPCVD furnace, at a temperature below 550° C., to a thickness between about 50 to 500 Angstroms, and doped during deposition via the incorporation of phosphine, in a silane, or in a disilane ambient, resulting in a bulk concentration between about 0 to $4E20$ atoms/$cm^3$, for said second amorphous silicon layer.

9. The method of claim 1, wherein said HSG silicon layer is formed using a seeding procedures, performed in situ, in an LPCVD furnace, at a temperature between about 550° to 580° C., at a pressure less than 1 torr, using silane or disilane, at a concentration of less than $1E-3$ moles/$m^3$, in a nitrogen ambient, for a time between about 5 to 120 min, followed by an annealing procedure, performed in a pure nitrogen ambient, at a temperature, between about 550° to 580° C., for a time between about 0 to 120 min.

10. The method of claim 1, wherein said capacitor dielectric layer is ONO, at an equivalent silicon dioxide thickness between about 40 to 80 Angstroms, created by an initial thermal oxidation of said HSG silicon layer, to form a silicon dioxide layer, between about 10 to 60 Angstroms, followed by a deposition of a silicon nitride layer, to a thickness between about 10 to 20 Angstroms, and thermal oxidation of said silicon nitride layer, creating a silicon oxynitride layer, on the underlying, said silicon dioxide layer.

11. The method of claim 1, wherein said upper polysilicon electrodes, of said stacked capacitor structure, are formed via deposition of a polysilicon layer, using an LPCVD procedure, at a thickness between about 1000 to 2000 Angstroms, and patterned using an anisotropic RIE procedure, using said photoresist shape as a mask, and using $Cl_2$ as a etchant for said polysilicon layer.

12. The method of claim 1, wherein storage node electrodes are formed via anisotropic RIE patterning of said HSG silicon layer, and of said first amorphous silicon layer, using $Cl_2$ as an etchant, and using said first photoresist shape as a mask.

13. The method of claim 1, wherein said fourth space, between said stacked capacitor structures, is between about 1000 to 2000 Angstroms.

14. A method for fabricating storage node electrode structures, for DRAM, stacked capacitor structures, using a dilute hydrofluoric, (HF), acid pre-clean procedure, applied to storage node shapes, followed by in situ deposition of amorphous silicon layers, and by an in situ seeding/annealing procedure, all performed in the same LPCVD furnace, forming an HSG silicon layer, on an amorphous silicon layer, with both layers overlying said storage node shapes, comprising the steps of:

providing a transfer gate transistor on a semiconductor substrate, comprised of a polysilicon gate structure, on an underlying gate insulator layer, and a source/drain region in said semiconductor substrate;

depositing an insulator layer on said transfer gate transistor;

planarizing said insulator layer;

opening a storage node contact hole in said insulator layer, exposing the top surface a source region, in said transfer gate transistor;

depositing a first polysilicon layer on top surface of said insulator layer, and completely filling said storage node contact hole;

patterning of said first polysilicon silicon layer to form polysilicon storage node shapes, with a first space, between said polysilicon storage node shapes;

performing said dilute HF acid pre-clean procedure;

depositing a heavily doped amorphous silicon layer, in said LPCVD furnace, on said polysilicon storage node shapes, and on said first space, including deposition on the sides of said polysilicon storage node shapes, creating a second space between said polysilicon storage node shapes;

in situ depositing an undoped, or a lightly doped, amorphous silicon layer, in said LPCVD furnace, on said heavily doped amorphous silicon layer, creating a third space between said polysilicon storage node shapes;

in situ seeding/annealing, in said LPCVD furnace, to convert said undoped amorphous silicon layer, to said HSG silicon layer, overlying said heavily doped amorphous silicon layer;

forming a capacitor dielectric layer on said HSG silicon layer;

depositing a second polysilicon layer on said capacitor dielectric layer;

forming a photoresist shape on said second polysilicon layer;

patterning of said second polysilicon layer, using said photoresist shape as a mask, to form polysilicon upper electrode shapes, for said DRAM, stacked capacitor structures; and patterning of said capacitor dielectric layer, using said photoresist shape as a mask;

patterning of said HSG silicon layer, and of said heavily doped amorphous silicon layer, using said photoresist shape as a mask, to form storage node electrodes, comprised of said HSG silicon layer, and said heavily doped amorphous silicon layer, on said polysilicon storage node shapes, and creating a fourth space between said storage node electrode structures.

15. The method of claim 14, wherein said first polysilicon layer is obtained via LPCVD procedures, at a temperature between about 500° to 700° C., to a thickness between about 1000 to 10000 Angstroms, and in situ doped, during deposition, via the addition of phosphine or arsine, to a silane, or to a disilane ambient.

16. The method of claim 14 wherein said polysilicon storage node shapes are formed via an anisotropic RIE procedure, applied to said first polysilicon layer, using $Cl_2$ as an etchant.

17. The method of claim 14, wherein said first space, located between said polysilicon storage node shapes, is between about 1500 to 4000 Angstroms.

18. The method of claim 14, wherein said dilute HF acid pre-clean procedure, is performed at room temperature, at about 25° C., using an acid solution comprised of one part HF and between about 100 to 200 parts de-ionized water.

19. The method of claim 14, wherein said heavily doped amorphous silicon layer is deposited in said LPCVD furnace, at a temperature between about 550° C. to 580°, to a thickness between about 50 to 1000 Angstroms, in situ doped, during deposition, via the addition of phosphorous to a silane ambient, resulting in a bulk concentration of about 4E20 atoms/$cm^3$, or greater, to the saturation level.

20. The method of claim 14, wherein said second space between said polysilicon storage node shapes, coated with said heavily doped amorphous silicon layer, is between about 1400 to 3000 Angstroms.

21. The method of claim 14, wherein said undoped, or lightly doped, amorphous silicon layer, is in situ deposited, in said LPCVD furnace, at a temperature below 550° C., to a thickness between about 50 to 500 Angstroms.

22. The method of claim 14, wherein said seeding/annealing procedure, used to convert said undoped amorphous silicon layer to said HSG silicon layer, is performed in situ, in said LPCVD furnace, comprised of the seeding procedure, performed at a temperature between about 550° to 580° C., at a pressure less than 1 torr, using silane or disilane, at a concentration of less than 1E–3 moles/$m^3$, in a nitrogen ambient, for a time between about 5 to 120 min, followed by the anneal cycle, performed at a temperature between about 550° to 580° C., for a time between about 0 to 120 min, in a pure nitrogen ambient.

23. The method of claim 14, wherein said capacitor dielectric layer is ONO, with an equivalent silicon dioxide thickness between about 40 to 80 Angstroms, created by growing a thin silicon oxide layer on said HSG silicon layer, at a thickness between about 10 to 50 Angstroms, depositing between about 10 to 60 Angstroms of a silicon nitride layer, and oxidizing said silicon nitride layer to from a silicon oxynitride layer on said thin silicon oxide layer.

24. The method of claim 14, wherein said second polysilicon layer is deposited using LPCVD procedures, at a temperature between about 500° to 700° C., to a thickness between about 1000 to 2000 Angstroms.

25. The method of claim 14, wherein said polysilicon upper electrode shapes are created using an anisotropic RIE procedure, applied to said second polysilicon layer, using $Cl_2$ as an etchant, and using said photoresist shape as a mask.

26. The method of claim 14, wherein said HSG silicon layer, and said heavily doped amorphous silicon layer, are patterned using an anisotropic RIE procedure, using $Cl_2$ as an etchant, and using said photoresist shape as a mask, creating said storage node electrode structures, comprised of said HSG silicon layer, and said heavily doped amorphous silicon layer, on said polysilicon storage node shapes.

27. The method of claim 14, wherein said fourth space, located between said storage node electrode structures, is between about 1000 to 2000 Angstroms.

* * * * *